United States Patent
Kang et al.

(10) Patent No.: US 9,595,674 B2
(45) Date of Patent: Mar. 14, 2017

(54) METHOD OF MANUFACTURING MASK

(71) Applicant: Samsung Display Co., Ltd., Yongin-si (KR)

(72) Inventors: Tae Min Kang, Suwon-si (KR); Young Suk Cho, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/855,890

(22) Filed: Sep. 16, 2015

(65) Prior Publication Data

US 2016/0248011 A1    Aug. 25, 2016

(30) Foreign Application Priority Data

Feb. 24, 2015   (KR) .................. 10-2015-0026021

(51) Int. Cl.
| | | |
|---|---|---|
| *H01L 21/00* | (2006.01) | |
| *H01L 51/00* | (2006.01) | |
| *H01L 51/56* | (2006.01) | |
| *H01L 51/50* | (2006.01) | |

(52) U.S. Cl.
CPC .......... *H01L 51/0002* (2013.01); *H01L 51/56* (2013.01); *H01L 51/5012* (2013.01)

(58) Field of Classification Search
CPC .. H01L 51/0002; H01L 51/56; H01L 51/5012
See application file for complete search history.

(56) References Cited

U.S. PATENT DOCUMENTS

| | | | | | |
|---|---|---|---|---|---|
| 3,967,985 | A | * | 7/1976 | Izumi ..................... | H01J 9/146 148/253 |
| 6,358,672 | B2 | * | 3/2002 | Jeoung ................... | G03F 7/2024 430/22 |
| 6,475,369 | B1 | * | 11/2002 | Cohen .................. | B81C 1/00126 205/118 |
| 9,332,631 | B2 | * | 5/2016 | Fukuda ................. | H05K 1/0271 |
| 2002/0146648 | A1 | * | 10/2002 | Ghandehari ........... | B82Y 10/00 430/324 |
| 2006/0042669 | A1 | * | 3/2006 | Kinomura ............... | B08B 11/02 134/135 |
| 2006/0063077 | A1 | * | 3/2006 | Hata ........................ | G03F 7/40 430/5 |
| 2008/0302391 | A1 | * | 12/2008 | Sone ......................... | B08B 3/08 134/21 |
| 2013/0337379 | A1 | * | 12/2013 | Yao ........................... | G03F 7/40 430/271.1 |

(Continued)

FOREIGN PATENT DOCUMENTS

| | | |
|---|---|---|
| JP | 2008-293699 | 12/2008 |
| JP | 2008293699 A * | 12/2008 |

(Continued)

*Primary Examiner* — Laura Menz
(74) *Attorney, Agent, or Firm* — H.C. Park & Associates, PLC

(57) ABSTRACT

A method of manufacturing a mask includes aligning a mask substrate comprising a thin film at a processing position, forming a coating layer comprising a cleaning solution material on a first surface of the mask substrate, forming a deposition pattern on a second surface of the mask substrate, and removing the coating layer from the mask substrate comprising the deposition pattern.

12 Claims, 3 Drawing Sheets

(56) References Cited

U.S. PATENT DOCUMENTS

2014/0085830 A1\* 3/2014 Fukuda ................ H01L 51/529
                                                      361/720

FOREIGN PATENT DOCUMENTS

| KR | 10-2003-0038598 | 5/2003 | | |
|----|----|----|----|----|
| KR | 10-0704688 | 4/2007 | | |
| KR | 10-1328821 | 11/2013 | | |
| WO | WO 2015023287 A1 \* | 2/2015 | ............. | H01L 21/78 |

\* cited by examiner

METHOD OF MANUFACTURING MASK

CROSS-REFERENCE TO RELATED APPLICATION

This application claims priority from and the benefit of Korean Patent Application No. 10-2015-0026021, filed on Feb. 24, 2015, which is hereby incorporated by reference for all purposes as if fully set forth herein.

BACKGROUND

Field

Exemplary embodiments of the present invention relate to a method of manufacturing a mask that may prevent damage to a mask substrate and a fixing plate.

Discussion of the Background

In a display device such as an organic light emitting display, a liquid crystal display, or the like, an organic material or a metal used as an electrode may be generally formed by a vacuum deposition method, which may form a thin film on a flat plate by depositing a corresponding material in vacuum atmosphere. In the vacuum deposition method, a substrate on which an organic thin film is to be formed may be positioned inside a vacuum chamber, a mask having the same pattern as a pattern of the thin film to be formed may be closely adhered to the substrate, and a deposition material such as the organic material may be deposited on the substrate by vaporizing or sublimating a deposition source.

In manufacturing the mask to form the deposition pattern, an invar of the thin film may be used as a mask substrate. The mask substrate may be closely adhered onto a fixing plate, such as a chuck or an auxiliary substrate, so that deposition pattern holes may be processed. However, since a thickness of the mask substrate may become thinner as a display device has higher resolution, damage such as a wrinkle may be caused on the mask substrate, when processing the deposition pattern holes. In addition, since the deposition pattern holes are processed to penetrate through the mask substrate, the mask substrate may not be fixed to the chuck by vacuum adsorption. Further, since the deposition pattern holes are directly processed in the mask substrate that is closely adhered onto the fixing plate when manufacturing the mask is used, damage to the fixing plate positioned below the mask substrate may occur.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a method of manufacturing a mask that may prevent damaging a fixing plate supporting a mask substrate and generating defects, such as a wrinkle, deformation, or the like on the mask substrate, when manufacturing the mask.

Additional aspects will be set forth in the detailed description which follows, and, in part, will be apparent from the disclosure, or may be learned by practice of the inventive concept.

According to an exemplary embodiment of the present invention, a method of manufacturing a mask includes aligning a mask substrate comprising a thin film at a processing position, forming a coating layer comprising a cleaning solution material on a first surface of the mask substrate, forming a deposition pattern on a second surface of the mask substrate, and removing the coating layer from the mask substrate comprising the deposition pattern.

The deposition pattern and the coating layer may include grooves.

Removing the coating layer may include cleaning the mask substrate with a cleaning solvent that dissolves the coating layer, washing the mask substrate from which the coating layer has been removed, with pure water, and vacuum-drying the mask substrate after washing with the pure water.

The cleaning solvent may include at least one of an alkali solution, water, ethanol, and acetone.

The cleaning solution material may include titanium soluble in the alkali solution.

The cleaning solution may include a resin material soluble in the alkali solution.

The method may further include forming an auxiliary coating layer including the cleaning solution material on the coating layer.

The auxiliary coating layer may include a metal thin film.

The auxiliary coating layer may include a polyester film.

The auxiliary coating layer may include opening parts through which the cleaning solvent passes to contact the coating layer.

The opening parts may be holes having a mesh shape or disposed in an equidistant interval across a surface of the auxiliary coating layer.

The deposition pattern may be disposed on portions of the second surface of the mask substrate, and the coating layer may be disposed only on portions of the first surface of mask substrate that overlaps the portions of the second surface on which the deposition pattern is disposed.

The method may further include disposing the mask substrate on a fixing plate such that the coating layer may contact the fixing plate.

According to an exemplary embodiment of the present invention, a method of manufacturing a mask includes aligning a mask substrate including a thin film at a processing position, forming a coating layer including a cleaning solution material on a first surface of the mask substrate, forming an auxiliary coating layer including the cleaning solution material on the coating layer, disposing the mask substrate on a fixing plate such that the auxiliary coating layer contacts the fixing plate, forming a deposition pattern on a second surface of the mask substrate, removing the coating layer and the auxiliary coating layer from the mask substrate by cleaning the mask substrate with a cleaning solvent that dissolves the cleaning solution material, and forming a light emitting layer on the first surface of the mask substrate.

According to an exemplary embodiment of the present invention, damage to a fixing plate supporting a mask substrate and generation of defects, such as a wrinkle, deformation in the mask substrate may be reduced, when manufacturing a mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF ILLUSTRATED THE EMBODIMENTS

Figure 1:
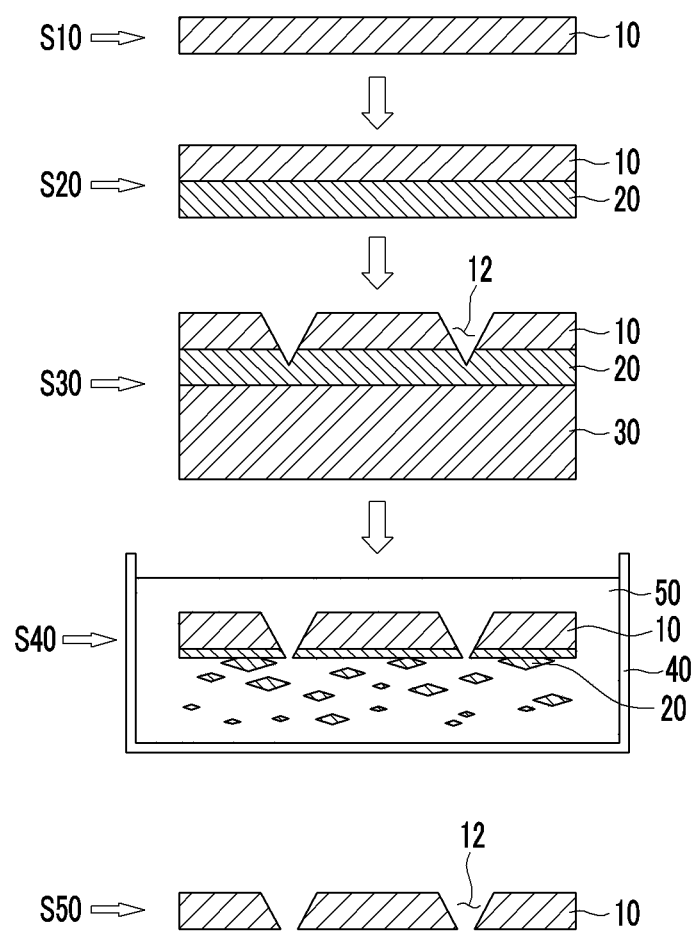
FIG. 1 is a drawing illustrating processes of manufacturing a mask according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof FIG. 1 is a drawing illustrating processes of manufacturing a mask according to an exemplary embodiment of the present invention. A method of manufacturing a mask will be described with reference to FIG. 1.

Referring to FIG. 1, in step S10, a mask substrate 10 of a thin film is prepared at a processing position. The mask substrate 10 may include a metal material having a low coefficient of thermal expansion such as an invar alloy, an iron-nickel, and cobalt alloy, or the like. According to the present exemplary embodiment, the mask substrate 10 includes the invar. Since the coefficient of thermal expansion of the invar may be similar to that of a glass material, the invar may be used as the mask substrate, which may rust easily. Accordingly, during a cleaning process of the mask substrate 10, the mask substrate 10 cleaned with pure water is vacuum-dried, thereby suppressing the mask substrate 10 from being rusted.

Next, in step S20, a coating layer 20 including a cleaning solution material, which is soluble in a cleaning solvent 50 is formed on one surface of the mask substrate 10. The cleaning solution material may include a material that may be soluble in the cleaning solvent 50 and not soluble in an etchant. The cleaning solution material may include titanium, a resin material, or the like, which is soluble in an alkali solution such as caustic soda. The cleaning solution material may include various materials, as long as the solution material may reduce damage to a fixing plate 30 that contacts the coating layer 20 and reduce an occurrence of defects, such as a wrinkle or deformation, on the mask substrate 10, in manufacturing the mask. According to the present exemplary embodiment, the cleaning solution material may include titanium or the resin material. The coating layer 20 may be formed across an overall surface of the other surface of the mask substrate 10, and on a region corresponding to a region on which at least a deposition pattern is formed. In this case, since the coating layer 20 is only partially formed on the mask substrate, costs for forming the coating layer 20 and costs for removing an unnecessary coating layer 20 may be reduced.

Next, in step S30, the mask substrate 10 on which the coating layer 20 is formed is disposed on the fixing plate 30, so that the coating layer 20 contacts the fixing plate 30. The fixing plate 30 may include a chuck or an auxiliary substrate. In this state, a deposition pattern is formed on the other surface of the mask substrate 10. In this case, a region on which the deposition pattern may be formed may correspond to a region in which a light emitting layer is to be formed on the other surface of the mask substrate 10. The deposition pattern and the coating layer 20 may include a groove or an opening part 12. For example, when forming the deposition pattern, the opening part 12 may be formed in the deposition pattern by using a laser. Therefore, since the deposition pattern is formed by irradiating the laser to only the region corresponding to the region in which the light emitting layer is to be formed, a more precise opening part 12 may be formed in the mask substrate 10. Here, a direction in which the laser is irradiated may be a direction toward the deposition pattern from the other surface of the mask substrate 10. The other surface of the mask substrate 10 may refer to an opposite surface to a surface of the mask substrate including the coating layer 20. The laser may have an energy level that may be absorbed in the deposition pattern. The laser may be of an ultraviolet region, a visible light region, and an infrared region.

Next, in step S40, the coating layer 20 is removed from the mask substrate 10 on which the deposition pattern is formed. Removing the coating layer 20 formed on one surface of the mask substrate 10 may include a cleaning operation, a pure water washing operation, and a vacuum-drying operation. More particularly, removing the coating layer 20 may include cleaning the mask substrate 10 formed on one surface of the mask substrate 10 with the cleaning solvent 50 solving the coating layer 20, washing the mask substrate 10 from which the coating layer 20 is removed with pure water, and vacuum-drying the mask substrate 10 washed with the pure water. When the mask substrate 10 is cleaned with the cleaning solvent 50, the mask substrate 10 may be immersed in the cleaning solvent 50 stored in a cleaning container 40, such that the coating layer 20 may be coupled to one surface of the mask substrate 10 on which the deposition pattern is formed. The cleaning solvent 50 may include one or more of an alkali solution, water, ethanol, and acetone. When the alkali solution is used as the cleaning solvent 50, the cleaning solution material may include titanium or the resin material, which is soluble in the alkali solution. According to an exemplary embodiment of the present invention, the coating layer 20 may also be removed by spraying or applying the cleaning solvent 50 to the coating layer 20.

When the mask substrate 10 is immersed in the cleaning solvent 50, the coating layer 20 coupled to one surface of the mask substrate 10 may be soluble in the cleaning solvent 50, and the coating layer 20 is then removed from one surface of the mask substrate 10. In step S50, when the mask substrate 10 washed with pure water is vacuum-dried after the coating layer 20 formed on one surface of the mask substrate 10 is removed, the mask substrate 10 may include the opening part 12 for the deposition pattern.

Figure 2:
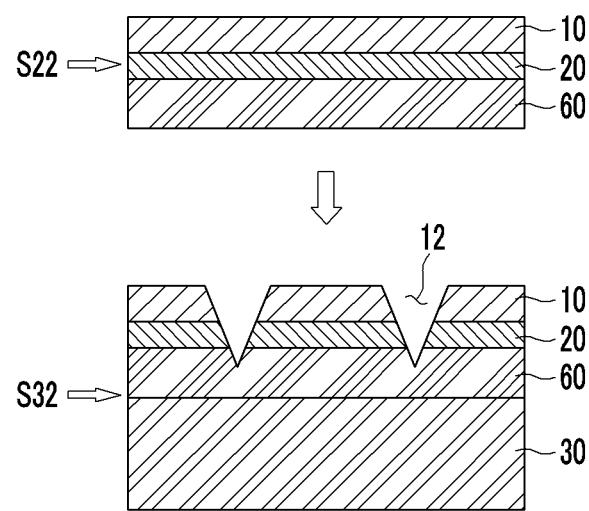
FIG. 2 is a drawing illustrating processes of manufacturing a mask according to an exemplary embodiment of the present invention.

FIG. 2 is a drawing illustrating processes of manufacturing a mask according to an exemplary embodiment of the present invention. Hereinafter, repeated description of mask elements that are substantially similar to the mask elements illustrated with reference to FIG. 1 will be simplified or omitted.

Referring to FIG. 2, in a method of manufacturing a mask according to the present exemplary embodiment, in step S22, the coating layer 20 is formed on one surface of the mask substrate 10 and an auxiliary coating layer 60 is formed on one surface of the coating layer 20. The auxiliary coating layer 60 may include one or more metal thin film and a polyethyleneterephthalate (PET) film. The auxiliary coating layer 60 may include the same cleaning solution material as the coating layer 20. In step S32, a deposition pattern may be formed to transmit a deposition material only in a region corresponding to a region in which a light emitting layer is to be formed on the other surface of the mask substrate 10. The auxiliary coating layer 60 and the coating layer 20 may be removed from the mask substrate 10 on which the deposition pattern is formed.

When the deposition pattern is formed to transmit the deposition material to the region corresponding to the region in which the light emitting layer is to be formed on the other surface of the mask substrate 10, while the auxiliary coating layer 60 of the mask substrate 10 that includes the coating layer 20 contacts the fixing plate 30, the opening part 12 may penetrate through the coating layer 20, which may partially damage the auxiliary coating layer 60. However, disposing the auxiliary coating layer 60 between the coating layer 20 and the fixing plate 30 may reduce damage to the fixing plate 30.

Since the deposition pattern of the mask substrate 10 is processed while the coating layer 20 or the auxiliary coating layer 60 is coupled to one surface of the mask substrate 10 as described above, damage such as a wrinkle may be reduced before and after the mask substrate 10 is processed. In addition, even when the deposition pattern is formed to include a deeper pattern that may extend to the coating layer 20 or the auxiliary coating layer 60, the deeper pattern of the deposition pattern may only affect the coating layer 20 or the auxiliary coating layer 60. Therefore, damage to the fixing plate 30 disposed below the coating layer 20 or the auxiliary coating layer 60 may be reduced. In addition, since a conventional method, of which the mask substrate 10 is penetrated while the mask substrate 10 is closely adhered to the fixing plate 30, may not be not used, the mask substrate 10 may be fixed with a vacuum adsorption method and a fixing equipment such as an electrostatic chuck may not be required. Further, since the mask substrate 10 is not penetrated, leakage of water into a lower portion of the mask substrate 10 may not occur, thereby an underwater processing may be used.

Figure 3:
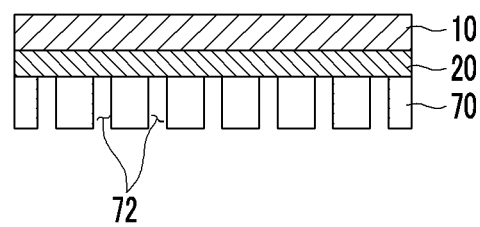
FIG. 3 is a drawing illustrating a process of manufacturing a mask according to an exemplary embodiment of the present invention.

FIG. 3 is a drawing illustrating a process of manufacturing a mask according to an exemplary embodiment of the present invention.

Referring to FIG. 3, in a method of manufacturing a mask according to the present exemplary embodiment, the coating layer 20 is formed on one surface of the mask substrate 10 and an auxiliary coating layer 70 is formed on one surface of the coating layer 20. The auxiliary coating layer 70 includes opening parts 72 through which the cleaning solvent 50 passes the coating layer 20. The opening parts 72 may be provided as holes having a mesh shape or an equidistant interval across a front surface of the auxiliary coating layer 70. The auxiliary coating layer 70 may be formed of the same cleaning solution material as the coating layer 20. Therefore, the auxiliary coating layer 70 may be soluble in the same cleaning solvent 50 as the coating layer 20. In addition, a deposition pattern may be formed to transmit a deposition material only in a region corresponding to a region in which a light emitting layer is to be formed on the other surface of the mask substrate 10, and the auxiliary coating layer 70 and the coating layer 20 may be removed from the mask substrate 10 including the deposition pattern.

As illustrated in FIG. 3, when the mask substrate 10 including the coating layer 20 and the auxiliary coating layer 70 is immersed in the cleaning solvent 50 to remove the coating layer 20 and the auxiliary coating layer 70 from the mask substrate 10 since the cleaning solvent 50 passes through the opening parts 72, the cleaning solvent 50 contacts the auxiliary coating layer 70 and the coating layer 20 more easily and rapidly, thereby dissolving the auxiliary coating layer 70 and the coating layer 20 more rapidly.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing a mask, the method comprising:
   aligning a mask substrate comprising a thin film at a processing position;
   forming a coating layer comprising a cleaning solution material on a first surface of the mask substrate;
   forming a deposition pattern on a second surface of the mask substrate; and
   removing the coating layer from the mask substrate comprising the deposition pattern, comprising:
      cleaning the mask substrate with a cleaning solvent that dissolves the coating layer;
      washing the mask substrate from which the coating layer has been removed, with pure water; and
      vacuum-drying the mask substrate after washing with the pure water.

2. The method of claim 1, wherein the deposition pattern and the coating layer comprise grooves.

3. The method of claim 1, wherein the cleaning solvent comprises at least one of an alkali solution, water, ethanol, and acetone.

4. The method of claim 3, wherein the cleaning solution material comprises titanium that is soluble in the alkali solution.

5. The method of claim 3, wherein the cleaning solution material comprises a resin material that is soluble in the alkali solution.

6. The method of claim 3, further comprising forming an auxiliary coating layer comprising the cleaning solution material on the coating layer.

7. The method of claim 6, wherein the auxiliary coating layer comprises a metal thin film.

8. The method of claim 6, wherein the auxiliary coating layer comprises a polyester film.

9. The method of claim 6, wherein the auxiliary coating layer comprises opening parts through which the cleaning solvent passes to contact the coating layer.

10. The method of claim 9, wherein the opening parts comprise holes having a mesh shape or disposed in an equidistant interval across a surface of the auxiliary coating layer.

11. The method of claim 1, wherein:
   the deposition pattern is disposed on portions of the second surface of the mask substrate; and
   the coating layer is disposed only on portions of the first surface of the mask substrate that overlaps the portions of the second surface on which the deposition pattern is disposed.

12. The method of claim 1, further comprising disposing the mask substrate on a fixing plate such that the coating layer contacts the fixing plate.

\* \* \* \* \*